(12) United States Patent
Chiyo et al.

(10) Patent No.: US 11,342,158 B2
(45) Date of Patent: May 24, 2022

(54) CHARGED PARTICLE BEAM SYSTEM

(71) Applicant: JEOL Ltd., Tokyo (JP)

(72) Inventors: Izuru Chiyo, Tokyo (JP); Naoki Fujimoto, Tokyo (JP); Tomoyuki Naganuma, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 17/223,322

(22) Filed: Apr. 6, 2021

(65) Prior Publication Data

US 2021/0313142 A1    Oct. 7, 2021

(30) Foreign Application Priority Data

Apr. 7, 2020 (JP) .............................. JP2020-069189

(51) Int. Cl.
*H01J 37/00* (2006.01)
*H01J 37/26* (2006.01)
*H01J 37/20* (2006.01)

(52) U.S. Cl.
CPC ............ *H01J 37/265* (2013.01); *H01J 37/20* (2013.01)

(58) Field of Classification Search
USPC ........................................................ 250/311
See application file for complete search history.

(56) References Cited

U.S. PATENT DOCUMENTS

| | | | | |
|---|---|---|---|---|
| 4,636,968 | A * | 1/1987 | Gotou | H01L 21/30 250/491.1 |
| 5,812,629 | A * | 9/1998 | Clauser | A61B 6/466 378/62 |
| 7,796,726 | B1 * | 9/2010 | Gendreau | G01N 23/223 378/46 |
| 9,449,784 | B2 * | 9/2016 | Naruse | H01J 37/18 |
| 2015/0137000 | A1 | 5/2015 | Naruse | |
| 2015/0166273 | A1 | 6/2015 | Price et al. | |
| 2015/0170874 | A1 | 6/2015 | Price et al. | |
| 2015/0243473 | A1 | 8/2015 | Price et al. | |
| 2016/0372302 | A1 | 12/2016 | Price et al. | |

FOREIGN PATENT DOCUMENTS

| | | |
|---|---|---|
| JP | H1130573 A | 2/1999 |
| JP | 2001250099 A | 9/2001 |
| JP | 2008269219 A | 11/2008 |
| JP | 201588237 A | 5/2015 |
| JP | 2017500722 A | 1/2017 |

OTHER PUBLICATIONS

Office Action issued in JP2020069189 dated Feb. 15, 2022.

* cited by examiner

*Primary Examiner* — Phillip A. Johnston
(74) *Attorney, Agent, or Firm* — The Webb Law Firm (57) ABSTRACT

There is provided a charged particle beam system capable of determining the type of each cartridge precisely. An electron microscope that embodies the charged particle beam system includes a discriminator for determining the type of each cartridge based on the range or distance measured by a laser range finder. Plural cartridges are received in a magazine. The laser range finder measures the range to a selected one of the plural cartridges which is placed in a measurement position. A first cartridge of a first type included in the plural cartridges has a first measurement surface at a first distance to the laser range finder when placed in the measurement position. A second cartridge of a second type has a second measurement surface at a second range to the laser range finder when placed in the measurement position.

7 Claims, 11 Drawing Sheets

CHARGED PARTICLE BEAM SYSTEM

CROSS-REFERENCE TO RELATED APPLICATION

This application claims priority to Japanese Patent Application No. 2020-069189 filed Apr. 7, 2020, the disclosure of which is hereby incorporated by reference in its entirety.

BACKGROUND OF THE INVENTION

1. Field of the Invention

The present invention relates to a charged particle beam system.

2. Description of the Related Art

When a sample is observed with a charged particle beam system such as an electron microscope, if the sample is a biological sample or polymeric material, and if the sample is irradiated with a charged particle beam, the morphology of the sample may be destroyed. As a result, the sample under normal condition may not be observed. In this case, if the sample is cooled, for example, below liquid nitrogen temperature, the morphology of the sample is not easily destroyed when it is irradiated with an electron beam. Consequently, the sample in its normal state can be observed.

However, in order to introduce a sample in a cooled state into the interior of an electron microscope that is in a vacuum state, adhesion of crystalline ice or frost to the sample should be prevented. For this purpose, various contrivances have been made.

For example, JP-A-2015-88237 discloses a charged particle beam system having a sample container for accommodating a sample and a refrigerant for cooling the sample. The sample container can be placed in communication with a sample exchange chamber via a partition valve. In this charged particle beam system, the interior of the sample container can be evacuated while the partition valve is closed. Therefore, the partition valve can be opened after the interior of the sample container is evacuated to a vacuum state and the refrigerant is solidified. Consequently, even if the refrigerant remains in the sample container, a sample can be introduced into the sample exchange chamber from the sample container, and the cooled sample can be readily loaded into the sample chamber.

In this charged particle beam system, the sample is held in a cartridge which comes in various types. Depending on the cartridge type, the cartridge will collide against the objective lens or other member, in which case the operational range of the sample stage (e.g., its tilt angle) must be restricted. Accordingly, in the charged particle beam system, an identifier is engraved in a side surface of each cartridge or a small part of a color is buried therein. The identifier or the color of the buried part is detected with a sensor to identify the type of the cartridge.

However, when the cartridge is cooled, the cartridge is frosted even in a vacuum state. This makes it impossible to precisely read the identifier or the color of the buried part. Hence, the cartridge type may be misdetected.

SUMMARY OF THE INVENTION

One aspect of the charged particle beam system associated with the present invention comprises:

a plurality of cartridges including a first cartridge of a first type and a second cartridge of a second type different from the first type;

a cartridge magazine capable of accommodating the cartridges;

a sample chamber that is vacuum pumped;

a sample exchange chamber in communication with the sample chamber via a partition valve;

a first transport arm device for conveying the magazine in the sample exchange chamber;

a laser range finder for measuring a range to a selected one of the cartridges accommodated in the magazine, the selected cartridge being placed in a measurement position; and a discriminator for determining the type of the selected cartridge based on the range measured by the laser range finder.

The first cartridge has a first measurement surface that is at a first range or distance to the laser range finder when the first cartridge is placed in the measurement position (i.e., the first cartridge is the selected cartridge). The second cartridge has a second measurement surface that is at a second range, different from the first range, to the laser range finder when the second cartridge is placed in the measurement position (i.e., the second cartridge is the selected cartridge).

With this charged particle beam system, the cartridge type can be precisely identified without being affected by the build-up of frost on the cartridge.

DETAILED DESCRIPTION OF THE INVENTION

Preferred embodiments of the present invention are hereinafter described in detail with reference to the accompanying drawings. It is to be noted that embodiments given below are not intended to unduly restrict the content of the present invention set forth in the claims and that not all the configurations set forth below are essential constituent components of the present invention.

In the following description, an electron microscope that irradiates a sample with an electron beam to permit observation or analysis of the sample is set forth as one example of the charged particle beam system associated with the present invention. The charged particle beam system associated with the present invention may also be an instrument which irradiates a sample with a charged particle beam other than an electron beam (e.g., an ion beam) to allow observations and analysis of the sample.

1. ELECTRON MICROSCOPE

Figure 1:
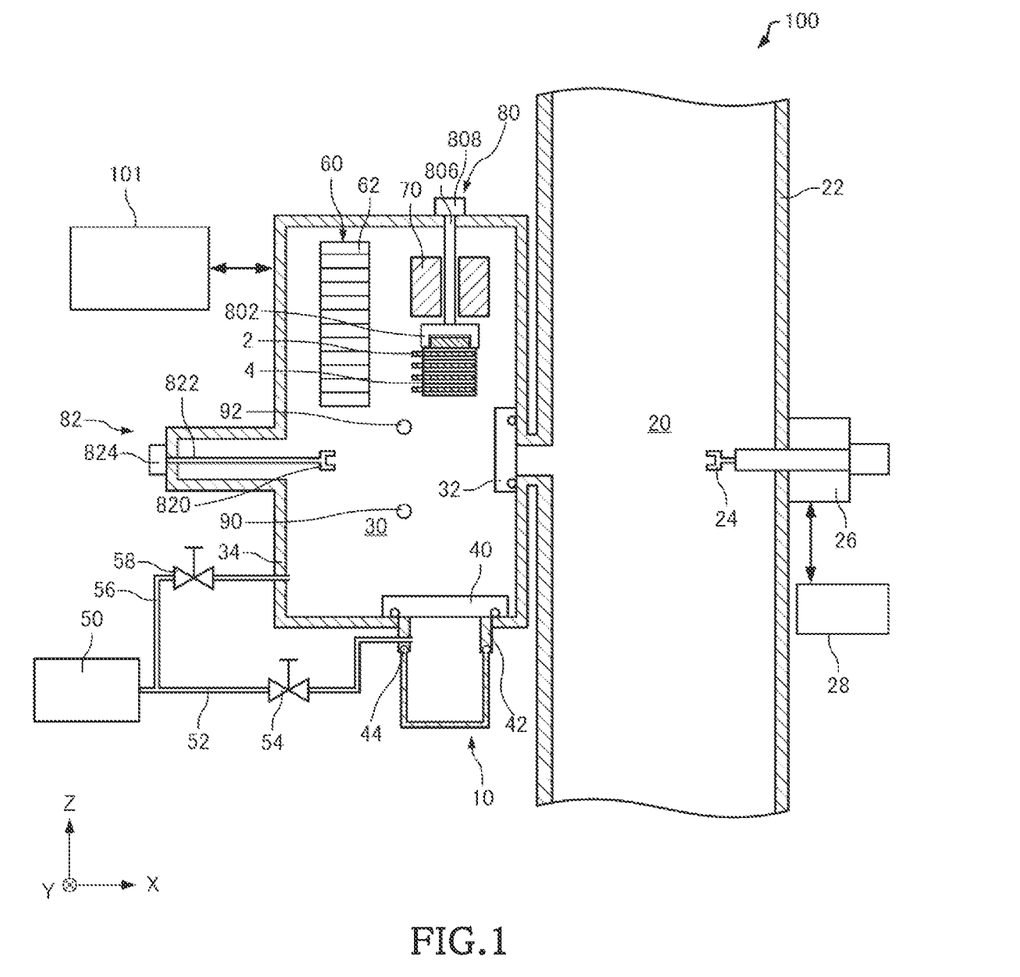
FIG. 1 is a block diagram of an electron microscope associated with one embodiment of the present invention.

An electron microscope associated with one embodiment of the present invention is first described by referring to FIG. 1, which schematically shows main portions of the electron microscope, 100, associated with the present embodiment. In FIG. 1, X-, Y-, and Z-axes are shown as mutually perpendicular axes.

As shown in FIG. 1, the electron microscope 100 includes a plurality of cartridges 2, a cartridge magazine 4, a sample container 10, a sample chamber 20, a cartridge holder 24, a sample stage or sample stage assembly 26, a stage control section 28, a sample exchange chamber 30, partition valves 32, 40, vacuum pumping equipment 50, a storage cabinet 60, a cooling block 70, a first transport arm device 80, a second transport arm device 82, a photosensor 90, a laser range finder 92, and a controller 101. In the following description, the electron microscope 100 is a transmission electron microscope (TEM).

The sample container 10 is used to carry a cooled sample. A sample and a refrigerant for cooling it are accommodated in the sample container 10. One example of the refrigerant is liquid nitrogen. Other examples include liquid methane, liquid ethane, and liquid butane. No restriction is imposed on the refrigerant as long as it can cool the sample and it condenses if vacuum pumped by the vacuum pumping equipment 50 described later.

The sample container 10 accommodates the cartridge magazine 4 in which the plural cartridges 2 are loaded. The cooled sample is held in each cartridge 2, which is a member in the form of a flat plate. Each cartridge 2 in which the sample is held is inserted and loaded into the magazine 4.

The magazine 4 has a plurality of cartridge holding portions and thus can accommodate the plural cartridges 2. In the illustrated example, the magazine 4 has four cartridge holding portions. When the cartridges 2 are loaded into the magazine 4, the cartridges 2 are inserted into the cartridge holding portions.

The sample is a biological sample, a polymeric material, or the like whose morphology is easily destroyed by a charged particle beam such as an electron beam or an ion beam. The sample is cooled, for example, below liquid nitrogen temperature (e.g., a cryogenic temperature) and then held in each cartridge 2.

Two types, for example, of cartridges 2 are for use with the electron microscope 100. In particular, a first cartridge 2a of a first type shown in FIG. 2 and a second cartridge 2b of a second type shown in FIG. 3 are used.

Figure 2:
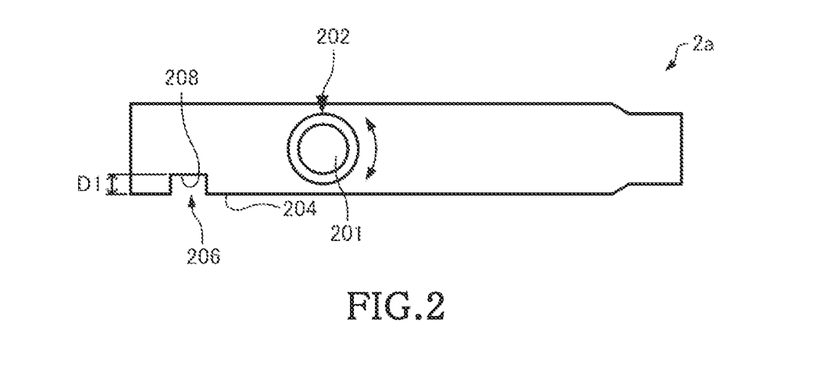
FIG. 2 is a schematic representation of a first cartridge.

FIG. 2 schematically shows the first cartridge 2a that has a rotational drive mechanism 202 for rotating the sample, for example, within a horizontal plane. The first cartridge 2a is provided with a through hole 201 for passage of an electron beam. The sample is held over the through hole 201. The sample is held to the first cartridge 2a, for example, with a C-ring.

The first cartridge 2a has a side surface 204 provided with a first recess 206. The surface of the first cartridge 2a that defines the first recess 206 constitutes a first measurement surface 208, which in turn is a flat surface, for example. When the first cartridge 2a is placed in a measurement position, laser light emitted from the laser range finder 92 hits the first measurement surface 208, and the laser range finder 92 measures the distance between the finder 92 and the first measurement surface 208. When the first cartridge 2a is in the measurement position, a first distance is defined between the first measurement surface 208 and the laser range finder 92.

Figure 3:
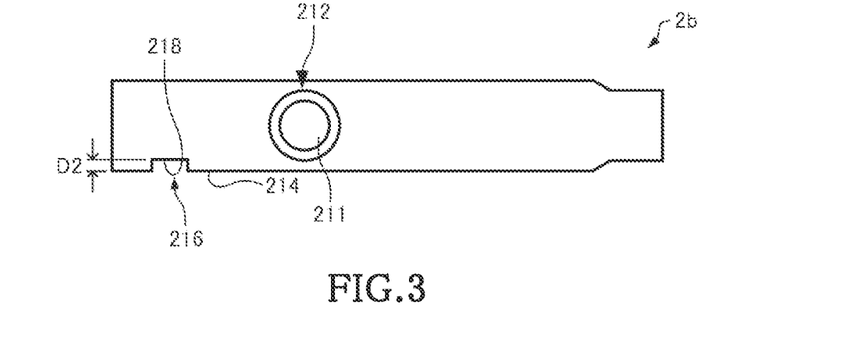
FIG. 3 is a schematic representation of a second cartridge.

FIG. 3 schematically shows the second cartridge 2b which has a tilt mechanism 212 for tilting the sample, for example. The second cartridge 2b is provided with a through hole 211 for passage of an electron beam. The sample is held over the through hole 211. The sample is held to the second cartridge 2b, for example, with a C-ring.

The second cartridge 2b has a side surface 214 provided with a second recess 216. The surface of the second cartridge 2b that defines the second recess 216 constitutes a second measurement surface 218, which in turn is a flat surface, for example. When the second cartridge 2b is placed in the measurement position, laser light emitted from the laser range finder 92 falls on the second measurement surface 218. When the second cartridge 2b is placed in the measurement position, the laser range finder 92 measures the distance between the laser range finder 92 and the second measurement surface 218. When the second cartridge 2b is in the measurement position, a second distance is defined between the second measurement surface 218 and the laser range finder 92.

The first recess 206 has a depth D1 greater than the depth D2 of the second recess 216. Accordingly, the first distance between the laser range finder 92 and the first cartridge 2a is greater than the second distance between the laser range finder 92 and the second cartridge 2b by the difference between the depths D1 and D2. The cartridges 2 and magazine 4 are preferably made from a thermally conductive material.

As shown in FIG. 1, the sample chamber 20 is a space inside a microscope column 22. This interior space is vacuum pumped (i.e., gas inside the chamber is evacuated in order to obtain a desired vacuum state) by vacuum pumping equipment (not shown). Consequently, the sample chamber 20 is maintained in vacuum. An ion pump, a scroll pump, a turbomolecular pump, and so on can be used as the vacuum pumping equipment for vacuum pumping the sample chamber 20.

The cartridge holder 24 is disposed in the sample chamber 20 and supports the cartridges 2 in the chamber 20. In the sample chamber 20, the sample is placed in position, for example, by moving or tilting the cartridge holder 24 with the sample stage 26, which is a goniometer stage, for example. The stage control section 28 controls the sample stage 26.

The sample chamber 20 is a space in which the sample is irradiated with an electron beam. The electron microscope 100 has an electron source (one example of charged particle source), an illumination optical system, an imaging optical system, and a detector, none of which are shown. In the electron microscope 100, the electron beam released from the electron source is condensed by the illumination optical system and made to impinge on the sample held to the cartridges 2 in the sample chamber 20. The electron beam transmitted through the sample is brought to a focus by the imaging optical system and detected by the detector. As a result, an electron microscope image can be obtained.

The sample exchange chamber 30 is in communication with the sample chamber 20 via the intervening partition valve 32. The partition valve 32 is used as a vacuum partition between the sample exchange chamber 30 and the sample chamber 20. The sample exchange chamber 30 and the sample chamber 20 are placed in communication with each other by opening the partition valve 32. The sample exchange chamber 30 and the sample chamber 20 are isolated from each other by closing the partition valve 32.

The sample exchange chamber 30 is a space surrounded by a vacuum vessel 34 and vacuum pumped by the vacuum pumping equipment 50. Consequently, the sample exchange chamber 30 can be kept in vacuum.

The sample container 10 is connected into the sample exchange chamber 30. In the illustrated example, the sample container 10 is connected into the sample exchange chamber 30 via a connective member 42, which in turn is connected into the sample exchange chamber 30. The connective member 42 has an end surface on which an O-ring 44 is mounted to provide a hermetic seal between the sample container 10 and the connective member 42.

When the sample container 10 is connected into the sample exchange chamber 30, the partition valve 40 is placed between the sample exchange chamber 30 and the sample container 10. The partition valve 40 is used as a vacuum partition between the sample exchange chamber 30 and the sample container 10. The sample exchange chamber 30 and the sample container 10 are placed in communication with each other by opening the partition valve 40. The sample exchange chamber 30 and the sample container 10 are placed out of communication with each other by closing the partition valve 40.

The vacuum pumping equipment 50 operates to vacuum pump the sample container 10. This pumping operation of the equipment 50 can be done when the sample container 10 is connected into the sample exchange chamber 30 and, at the same time, the partition valve 40 is closed. Consequently, the interior of the sample container 10 is vacuum pumped and the freezing point of the refrigerant rises. Hence, the refrigerant can be solidified.

The vacuum pumping equipment 50 vacuum pumps the sample container 10 via an exhaust pipe 52 which is connected with the connective member 42 in the illustrated example. A solenoid valve 54 is mounted in the exhaust pipe 52. Furthermore, the vacuum pumping equipment 50 vacuum pumps the sample exchange chamber 30 via an exhaust pipe 56 in which a solenoid valve 58 is mounted. An oil-sealed rotary vacuum pump, an ion pump, a scroll pump, a turbomolecular pump, or the like can be used as the vacuum pumping equipment 50.

The storage cabinet 60 is mounted in the sample exchange chamber 30 and can hold the cartridges 2 therein. The storage cabinet 60 has a plurality of storage portions 62 that hold the plural cartridges 2, respectively. Thus, the plural cartridges 2 can be held in the storage cabinet 60. In the illustrated example, the storage portions 62 are arranged along the Z-axis.

The storage cabinet 60 is cooled and so it can store samples while cooling them. The storage cabinet 60 can be moved in an up/down direction, i.e., along the Z-axis.

Each cartridge 2 can be conveyed between the magazine 4 and the storage cabinet 60 using the first transport arm device 80 and the second transport arm device 82. Also, each cartridge 2 can be transported between the cartridge holder 24 and the storage cabinet 60 using the second transport arm device 82.

The cooling block 70 is mounted in the sample exchange chamber 30. The cooling block 70 is cooled. The cooling block 70 is in thermal communication with a tank, for example, storing the refrigerant such as liquid nitrogen in a manner not illustrated. The first transport arm device 80 has a grip mechanism 802. When the grip mechanism 802 is in a standby position, the cooling block 70 is so located that the grip mechanism 802 strikes the cooling block 70.

The first transport arm device 80 carries the magazine 4 between the sample container 10 and the sample exchange chamber 30. The first transport arm device 80 moves the magazine 4 located in the sample container 10 into the sample exchange chamber 30. Furthermore, the first transport arm device 80 moves the magazine 4 from inside the sample exchange chamber 30 into the sample container 10.

Figure 4:
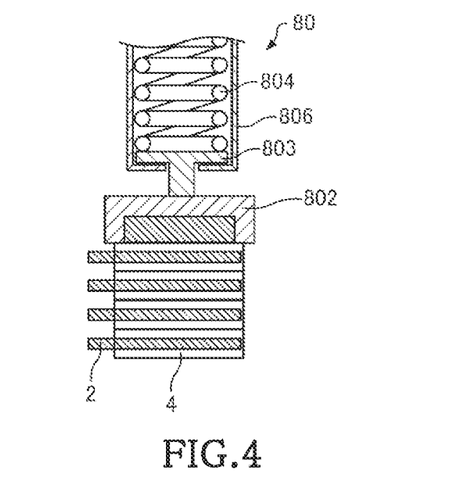
FIG. 4 is a schematic cross-sectional view of a first transport arm device.

FIG. 4 schematically shows only a front end portion of the first transport arm device 80. The first transport arm device 80 has the grip mechanism 802, a resilient member 804, a rod 806, and a drive mechanism 808.

The grip mechanism 802 grips the magazine 4. For example, the grip mechanism 802 has two arms which hold the magazine 4 therebetween to grip the magazine 4. The grip mechanism 802 is connected to the resilient member 804. In the example shown in FIG. 4, the grip mechanism 802 is connected to the resilient member 804 via a connective member 803.

The connective member 803 is received in the rod 806 and connected to the resilient member 804. The connective member 803 is greater in width than an opening formed in the rod 806. Therefore, the connective member 803 does not protrude out of the rod 806.

The resilient member 804 is received in the rod 806. For example, the resilient member 804 is a compression spring. The grip mechanism 802 is coupled to the front end of the resilient member 804 via the connective member 803.

The grip mechanism 802 is mounted to the front end of the rod 806 via the resilient member 804. The rod 806 is hollow and receives the resilient member 804 therein.

The drive mechanism 808 can move the grip mechanism 802 in an up/down direction, i.e., along the Z-axis. Consequently, in the first transport arm device 80, the magazine 4 can be moved up and down. For example, the rod 806 is capable of expansion and contraction, and the drive mechanism 808 moves the grip mechanism 802 by elongating and contracting the rod 806. Alternatively, the drive mechanism 808 may move the grip mechanism 802 by inserting or withdrawing the rod 806.

The second transport arm device 82 carries each cartridge 2 between the sample exchange chamber 30 and the sample chamber 20. For example, the second transport arm device 82 takes out the cartridges 2 from the magazine 4 held by the first transport arm device 80 and loads them into the cartridge holder 24 within the sample chamber 20. Also, the second transport arm device 82 takes out the cartridges 2 from the cartridge holder 24 and inserts them into the magazine 4 held by the first transport arm device 80.

Furthermore, the second transport arm device 82 carries the cartridges 2 between the magazine 4 held by the first transport arm device 80 and the storage cabinet 60. The second transport arm device 82 has a grip mechanism 820 for gripping a selected one of the cartridges 2, a rod 822, and a drive mechanism 824 for moving the grip mechanism 820.

The grip mechanism 820 has two arms to grip each cartridge 2, for example, by holding it between the arms. The drive mechanism 824 can move the grip mechanism 820 in a horizontal direction, i.e., along the X-axis. Consequently, the second transport arm device 82 can move each cartridge 2 in a horizontal direction.

The photosensor 90 has a light emitting section and a light receiving section which are disposed on the opposite sides of that of the cartridges 2 in the magazine 4 which is located in the detection position. The photosensor 90 detects the presence or absence of that cartridge 2 (hereinafter may be referred to as the (currently) "measured cartridge" in the magazine 4). The light emitting section emits light, and light is received by the light receiving section and the amount of light is detected. The presence or absence of the measured cartridge 2 in the magazine 4 is detected based on the amount of light detected by the photosensor 90.

The laser range finder 92 measures the range or distance to the measured cartridge 2 received in the magazine 4. In particular, the laser range finder 92 measures the range to the measurement surface of the measured cartridge 2 located in the measurement position. More specifically, the laser range finder 92 measures the distance between the point hit by laser light and the laser range finder 92. The laser range finder 92 determines the range, for example, based on the phase difference between the emitted light and the reflected light.

The laser range finder 92 is disposed outside the sample exchange chamber 30. The laser range finder 92 emits the laser light to the measured cartridge 2 in the sample exchange chamber 30 through a window formed in the vacuum vessel 34. The finder 92 detects light reflected from the cartridge 2 also through the window formed in the vacuum vessel 34. In the electron microscope 100, the type of the measured cartridge 2 is identified based on the range measured by the laser range finder 92.

Figure 5:
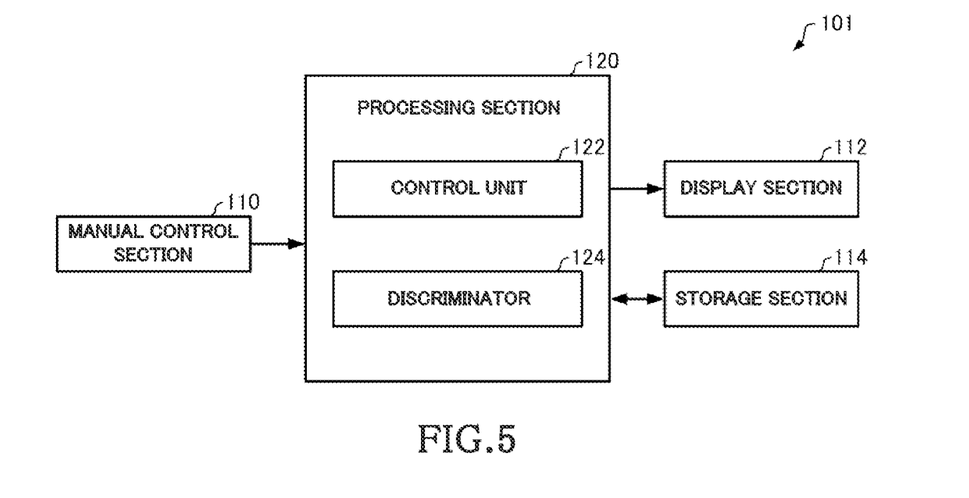
FIG. 5 is a block diagram illustrating the configuration of a controller.

The controller 101 controls various portions of the electron microscope 100. FIG. 5 illustrates the configuration of the controller 101. As shown in FIG. 5, the controller 101 includes a manual control section 110, a display section 112, a storage section 114, and a processing section 120. The manual control section 110 permits a user to enter manual control information, and outputs the entered manual control information to the processing section 120. The function of the manual control section 110 can be realized by a hardware device such as a keyboard, a mouse, buttons, a touch panel, or a touch pad.

The display section 112 displays images generated by the processing section 120. The function of the display section 112 can be realized by an LCD (liquid crystal display) or a touch panel that functions also as the manual control section 110.

Computer programs and various kinds of data permitting a computer to operate as various portions of the processing section 120 are stored in the storage section 114. The storage section 114 also serves as a working area for the processing section 120. The function of the storage section 114 can be realized by a hard disk, a RAM (Random Access Memory), or the like.

The functions of the processing section 120 can be realized by executing computer programs using a hardware device such as various processors (e.g., CPUs (central processing units)) or DSP (digital signal processor)). The processing section 120 includes a control unit 122 and a discriminator 124. The control unit 122 controls the partition valves 32, 40, solenoid valves 54, 58, the storage cabinet 60, the first transport arm device 80, the second transport arm device 82, and others.

The discriminator 124 detects the presence or absence of the measured cartridge 2 in the magazine 4 based on the amount of light detected by the photosensor 90. If there is the measured cartridge 2, the light from the photosensor 90 is blocked by the cartridge 2. If there is no such cartridge 2, the light from the photosensor 90 is detected without being blocked by any cartridge 2. Therefore, if the amount of light detected by the photosensor 90 is below a preset threshold value, the discriminator 124 determines that there is the cartridge 2 to be measured. If the amount of light detected by the photosensor 90 is in excess of the preset threshold value, the discriminator determines that there is no such cartridge 2.

The discriminator 124 detects the type of the measured cartridge 2 based on the range measured by the laser range finder 92. As shown in FIGS. 2 and 3, the depth D1 of the first recess 206 is greater than the depth D2 of the second recess 216. Therefore, the range to the first cartridge 2a measured by the laser range finder 92 and the range to the second cartridge 2b measured by the laser range finder 92 are different by an amount equal to the difference between the depths D1 and D2. Utilizing this, the discriminator 124 detects the type of the measured cartridge 2.

For example, the discriminator 124 determines the type of the measured cartridge 2 corresponding to the measured range by searching through a table showing the relationship between the types of the plural cartridges 2 and their ranges measured by the laser range finder 92, the table being stored in the storage section 114.

Furthermore, the discriminator 124 may identify the type of the measured cartridge 2 by comparing the range measured by the laser range finder 92 with the threshold value. The threshold value is set to a value in between the first distance from the laser range finder 92 to the first measurement surface 208 of the first cartridge 2a and the second distance from the laser range finder 92 to the second measurement surface 218 of the second cartridge 2b. In this case, if the range measured by the laser range finder 92 and the threshold value are compared, and if the range is greater than the threshold value, it can be determined that the measured cartridge is the first cartridge 2a. If the range is smaller than the threshold value, it can be determined that the measured cartridge is the second cartridge 2b.

2. OPERATION OF ELECTRON MICROSCOPE

The operation of the electron microscope 100 is next described. In the following description, a procedure for loading the cartridges 2 into the sample chamber 20 and the related operation of the electron microscope 100 are set forth.

Figure 6:
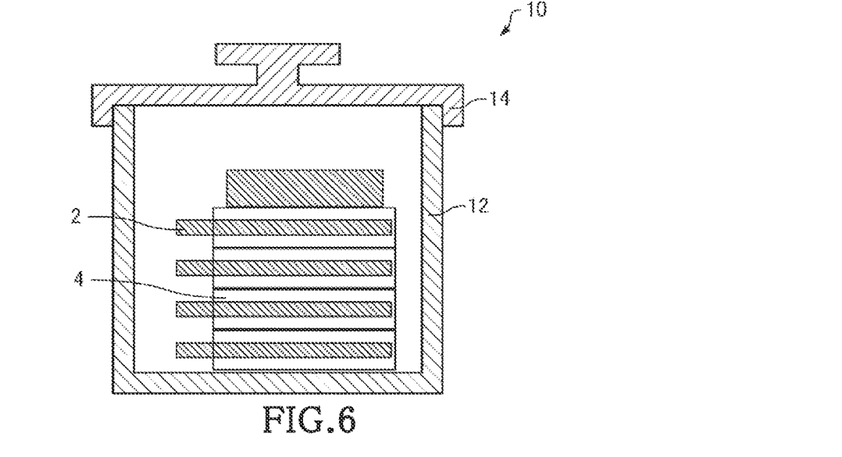
FIG. 6 is a schematic cross-sectional view of a sample container.

FIG. 6 is a schematic cross-sectional view of the sample container 10. As shown in FIG. 6, each cartridge 2 in which a sample is held is inserted and thus received into the magazine 4. In the illustrated example, plural cartridges 2 are received in the magazine 4. The sample is embedded in ice.

Then, the magazine 4 and the refrigerant are received in the sample container 10. The sample container 10 has a receiving portion 12 and a cover 14. By receiving the magazine 4 and the refrigerant in the receiving portion 12 and closing the opening of the receiving portion 12 with the cover 14, adhesion of crystalline ice and frost to the sample can be reduced while cooling the sample.

Figure 7:
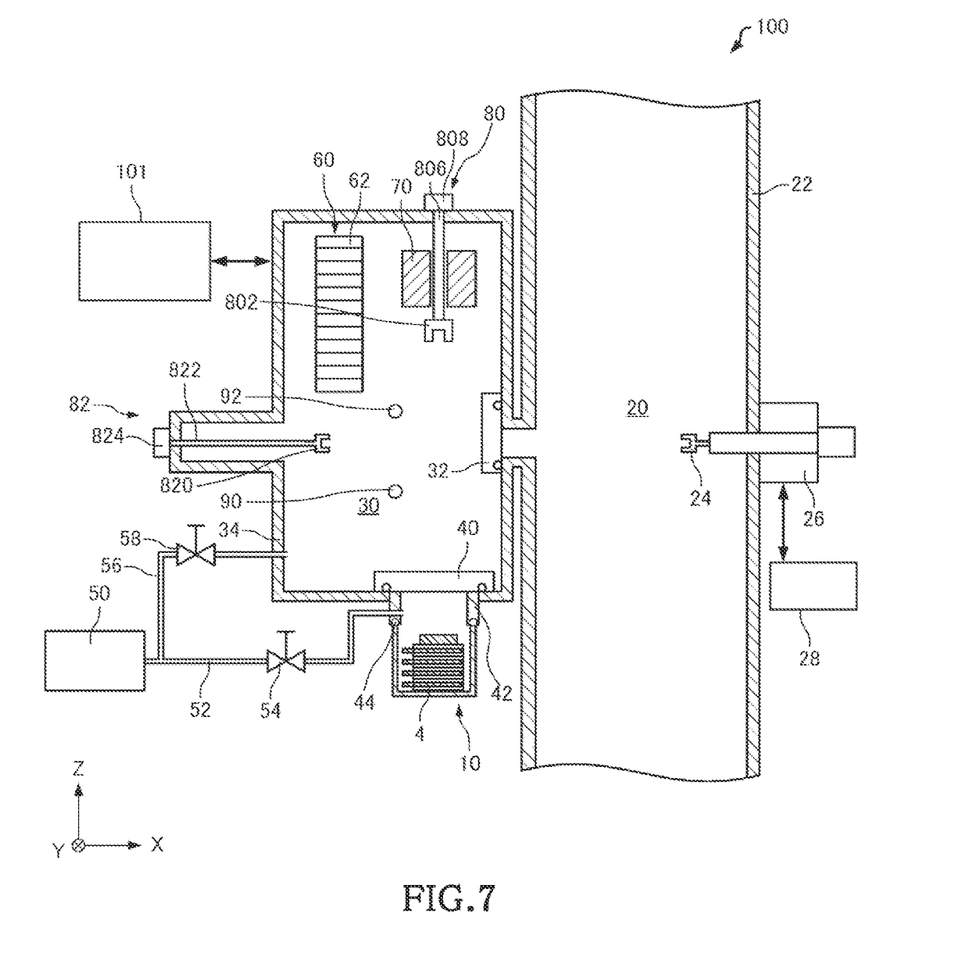
FIG. 7 is a block diagram, partially in cross section, illustrating a state in which the sample container is loaded in a sample exchange chamber.

FIG. 7 schematically shows a state in which the sample container 10 is mounted in the sample exchange chamber 30. Then, as shown in FIG. 7, the sample container 10 is mounted in the sample exchange chamber 30. In particular, the cover 14 of the sample container 10 is removed and mounted to the connective member 42. Consequently, the sample container 10 is placed in communication with the sample exchange chamber 30 via the partition valve 40. At this time, the partition valve 40 is closed. The O-ring 44 seals between the connective member 42 and the sample container 10.

The interior of the sample exchange chamber 30 is vacuum pumped and maintained in vacuum by the vacuum puming equipment 50. That is, the solenoid valve 58 is kept open. The partition valve 32 is closed.

Figure 8:
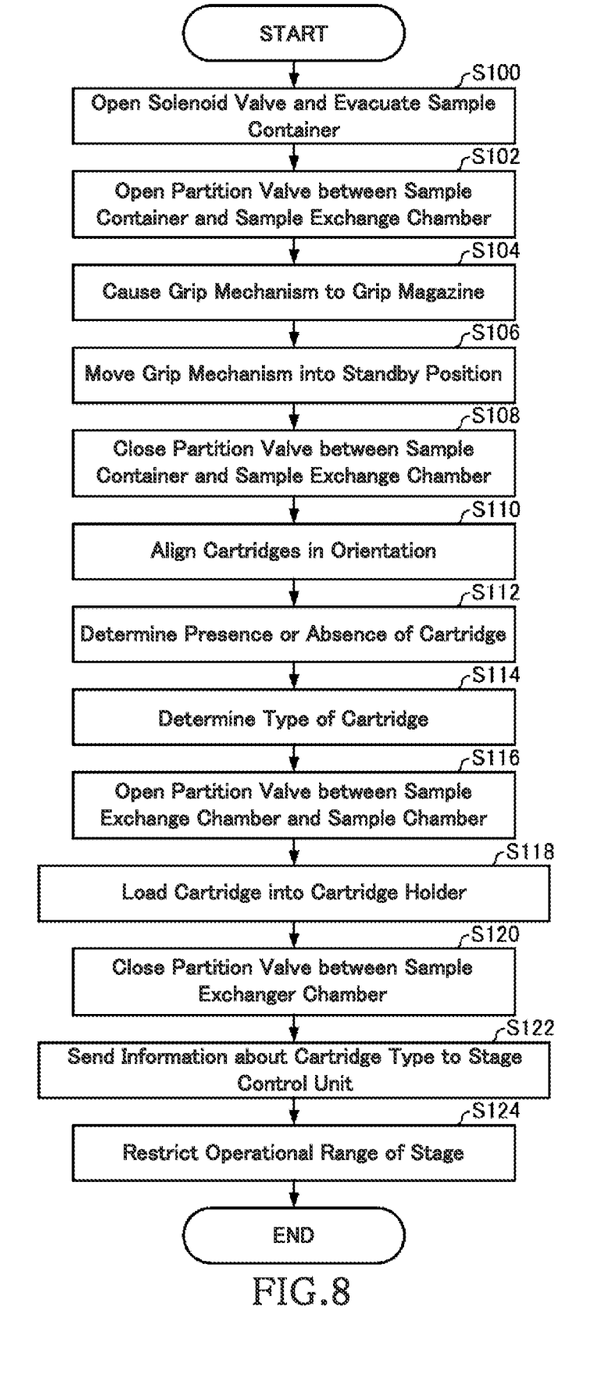
FIG. 8 is a flowchart illustrating one example of the operational sequence of the electron microscope of FIG. 1.

FIG. 8 is a flowchart illustrating one example of the operational sequence of the electron microscope 100. FIGS. 9-17 illustrate the operational sequence of the electron microscope 100.

If a user enters an instruction through the manual control section 110, for example, to introduce the magazine 4 into the sample exchange chamber 30, the control unit 122 starts a processing sequence.

The control unit 122 first opens the solenoid valve 54 (S100). As a result, the interior of the sample container 10 is vacuum pumped. This causes the refrigerant in the sample container 10 to solidify. The control unit 122 closes the solenoid valve 54 after a lapse of a given time, for example.

Figure 9:
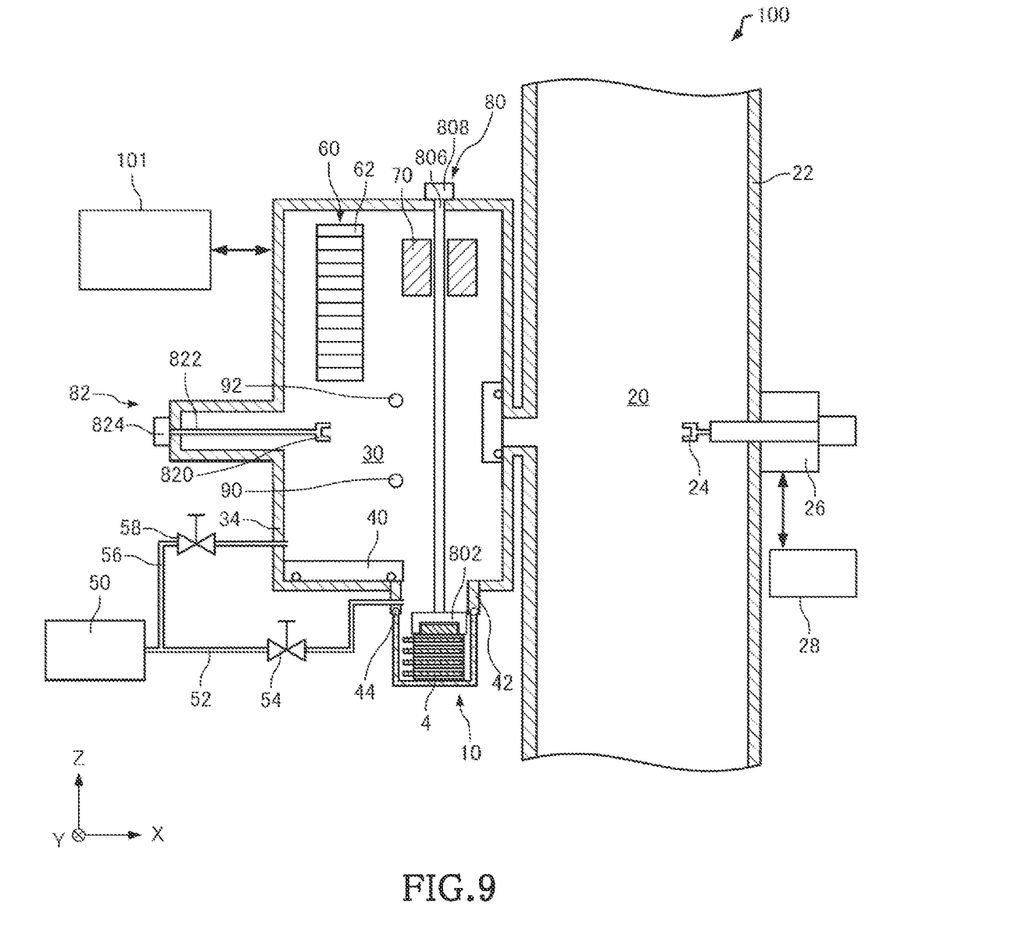
FIG. 9 is a block diagram, partially in cross section, of the electron microscope of FIG. 1, illustrating its operation.

After closing the solenoid valve 54, the control unit 122 opens the partition valve 40 as shown in FIG. 9 (S102). Because the refrigerant in the sample container 10 is solidified at this time, the degree of vacuum in the sample exchange chamber 30 can be prevented from deteriorating even if the refrigerant is left in the sample container 10.

Figure 10:
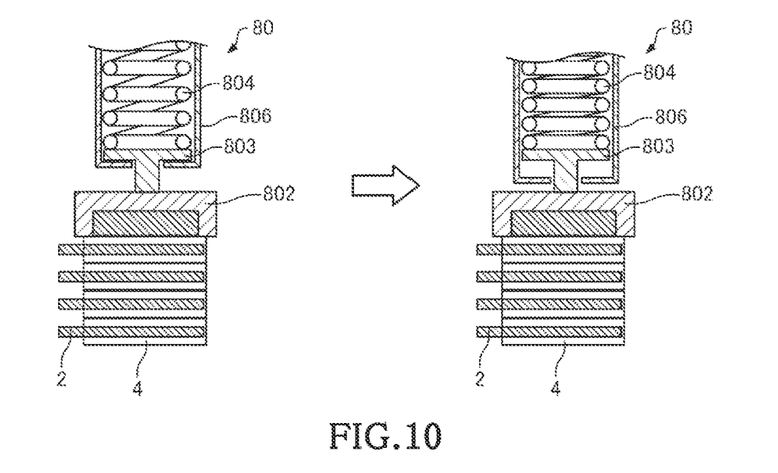
FIG. 10 shows fragmentary cross-sectional views of the first transport arm device.

Then, the control unit 122 causes the grip mechanism 802 to grip the magazine 4 (S104). As shown in FIG. 9, the grip mechanism 802 moves from inside the sample exchange chamber 30 into the sample container 10 and strikes the top of the magazine 4. At this time, as shown in FIG. 10, the resilient member 804 contracts to thereby absorb the shock produced by the collision of the grip mechanism 802 against the sample container 10; otherwise, a vacuum leak would occur. Upon the collision of the grip mechanism 802 against the top of the magazine 4, the control unit 122 causes the grip mechanism 802 to grip the magazine 4.

Figure 11:
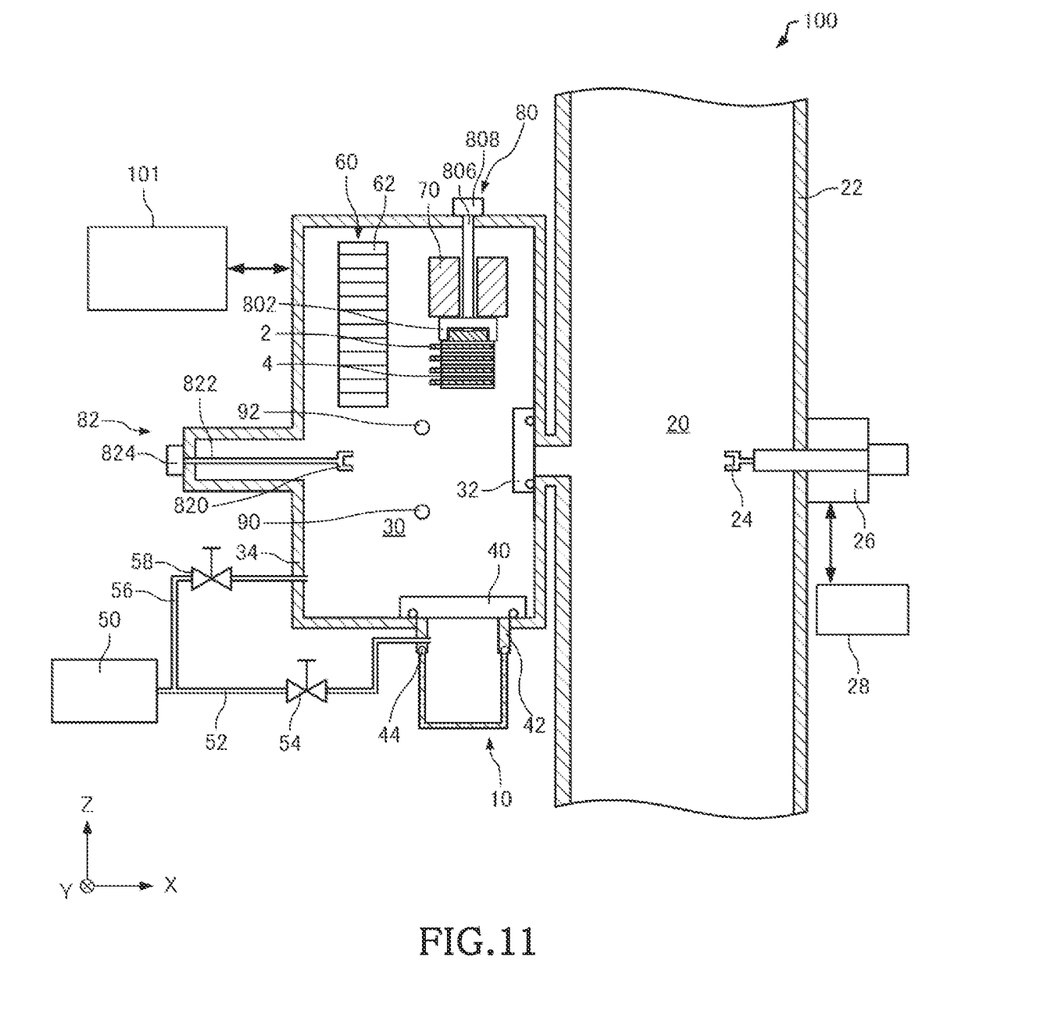
FIG. 11 is a block diagram illustrating the operation of the electron microscope of FIG. 1.

Then, the control unit 122 causes the drive mechanism 808 to move the grip mechanism 802 into the standby position within the sample exchange chamber 30 as shown in FIG. 11 (S106). Consequently, the magazine 4 is conveyed into the sample exchange chamber 30.

Figure 12:
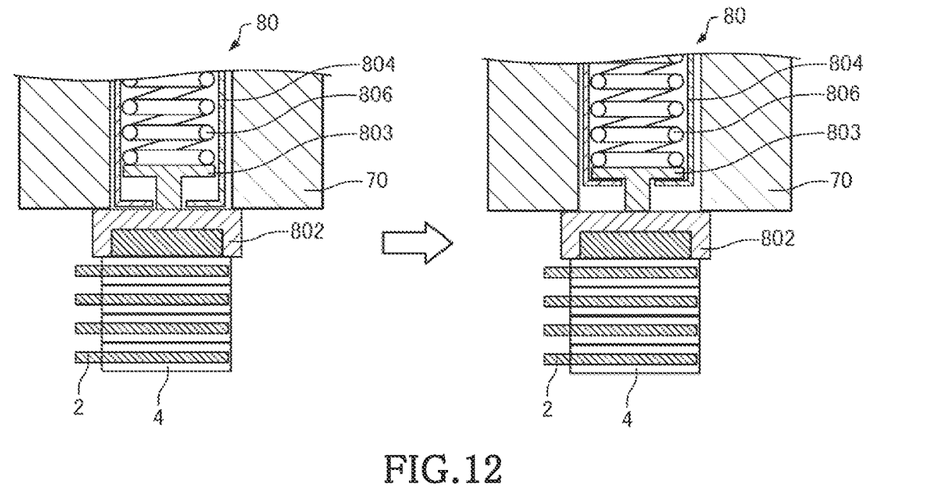
FIG. 12 shows fragmentary cross-sectional views of the first transport arm device.

When moved into the standby position, the grip mechanism 802 strikes the cooling block 70. As shown in FIG. 12, this enables the resilient member 804 to be extended. In consequence, positional deviation of the magazine 4 can be prevented.

When the grip mechanism 802 strikes on the top of the magazine 4 as already described in relation to FIG. 10, for example, the resilient member 804 contracts and may not return to its original state completely. This causes a positional deviation of the magazine 4. At this time, the second transport arm device 82 may not take out an intended one of the cartridges 2 from the magazine 4. Furthermore, the photosensor 90 may not detect the amount of light correctly. The laser range finder 92 may not precisely measure the range to the intended cartridge 2.

As described previously, in the electron microscope 100, the resilient member 804 is made extensible by causing the grip mechanism 802 to collide with the cooling block 70. Consequently, positional deviation of the magazine 4 can be prevented and thus the foregoing problems can be avoided.

Then, the control unit 122 closes the partition valve 40 (S108). The control unit 122 then controls and operates the second transport arm device 82 such that the plural cartridges 2 received in the magazine 4 are aligned in orientation (S110).

Figure 13:
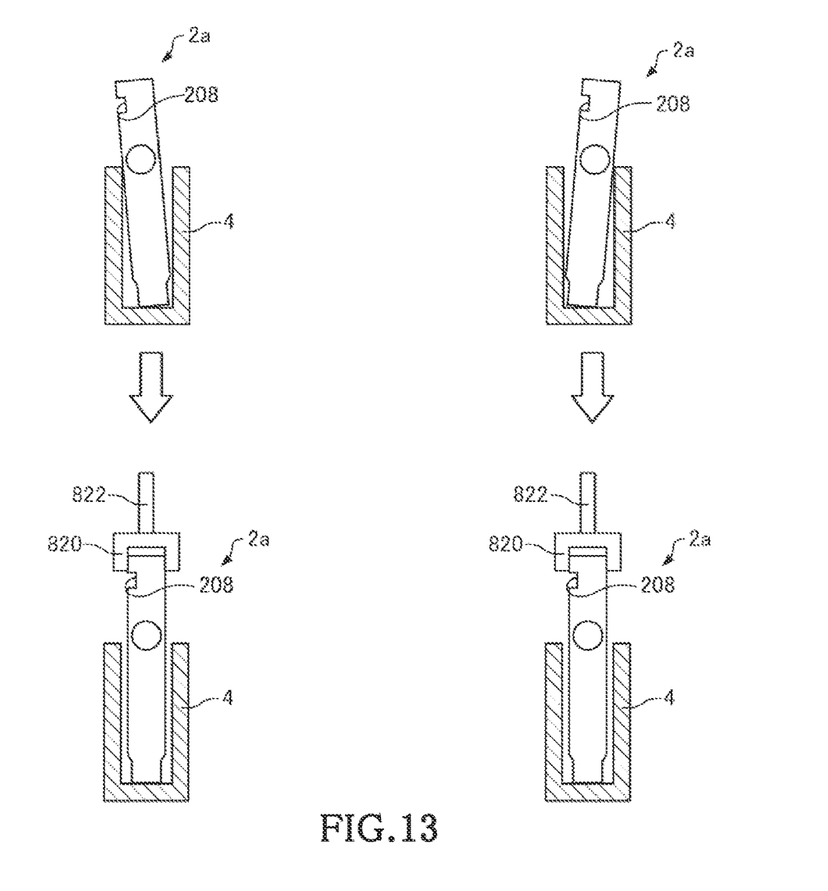
FIG. 13 shows fragmentary cross-sectional views of the first cartridge, illustrating its different operational states.

As noted above, every cartridge 2 is manually inserted into the magazine 4. Therefore, as shown in FIG. 13, all the cartridges 2 inserted in the magazine 4 may be nonuniform in orientation. This makes it impossible to precisely measure the distance between the laser range finder 92 and the measurement surface 208 by the laser range finder 92. Therefore, in the electron microscope 100, the plural cartridges 2 received in the magazine 4 are aligned in orientation by the second transport arm device 82.

In particular, the control unit 122 causes the first transport arm device 80 to move the magazine 4 such that the cartridge 2 received in the first stage of the magazine 4 is placed in the delivery position. Then, the control unit 122 causes the second transport arm device 82 to grip the front end of the cartridge 2 located in the delivery position and to adjust the orientation of this cartridge 2. Similar processing is performed for the cartridges 2 in the second and following stages. Consequently, all the cartridges 2 received in the magazine 4 can be aligned in orientation.

Figure 14:
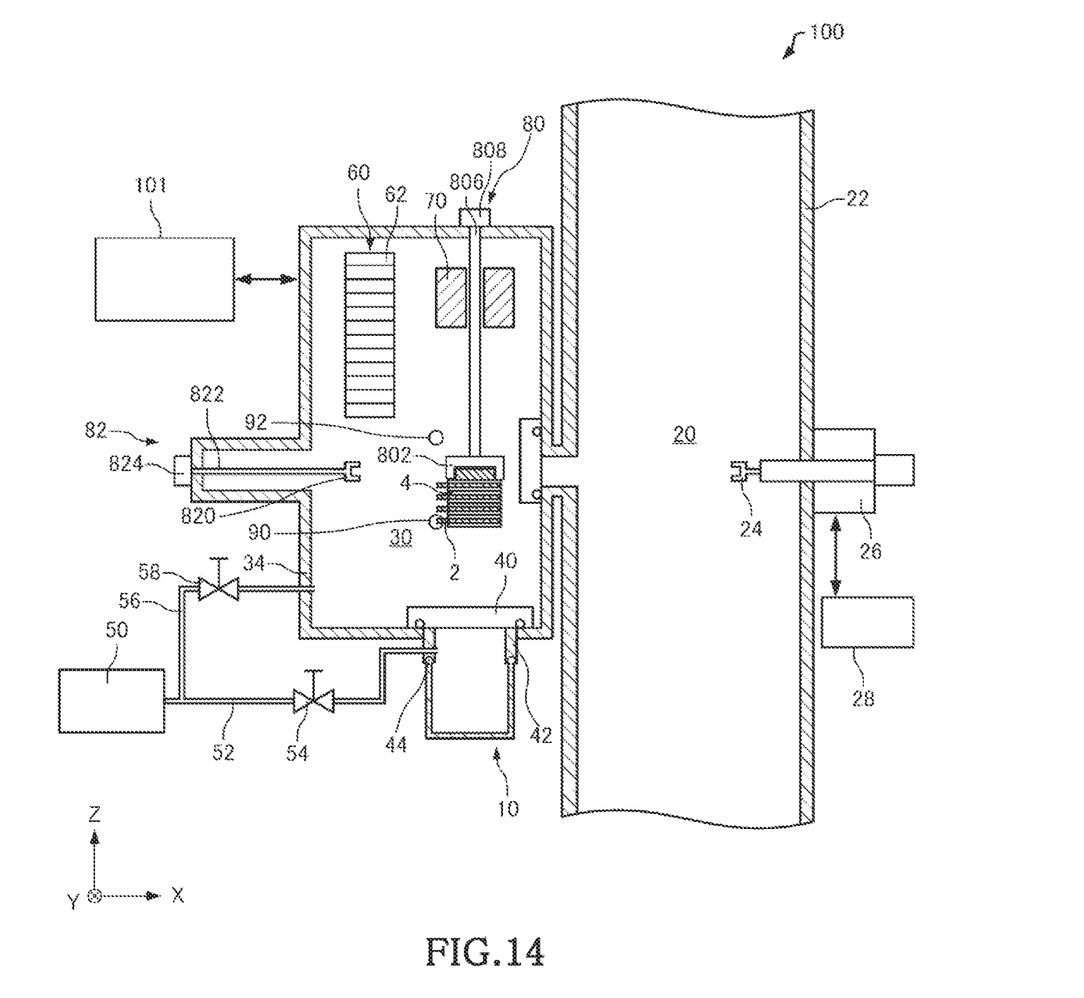
FIGS. 14, 15, 16, and 17 are block diagrams, partially in cross section, of the electron microscope of FIG. 1, illustrating its different operational states.

The discriminator 124 then detects the presence or absence of any cartridge 2 (S112). As shown in FIG. 14, the control unit 122 causes the first transport arm device 80 to move the magazine 4 such that the first stage of the magazine 4 is placed into the detection position. The discriminator 124 derives the amount of light from the first stage of the magazine 4 detected by the photosensor 90 and determines the presence or absence of any cartridge 2 in the first stage based on the amount of light. Similar processing is performed for the cartridges 2 in the second and following stages. As a result, information about the presence or absence of the cartridges 2 in the magazine 4 can be obtained, and this information is stored in the storage section 114.

Figure 15:
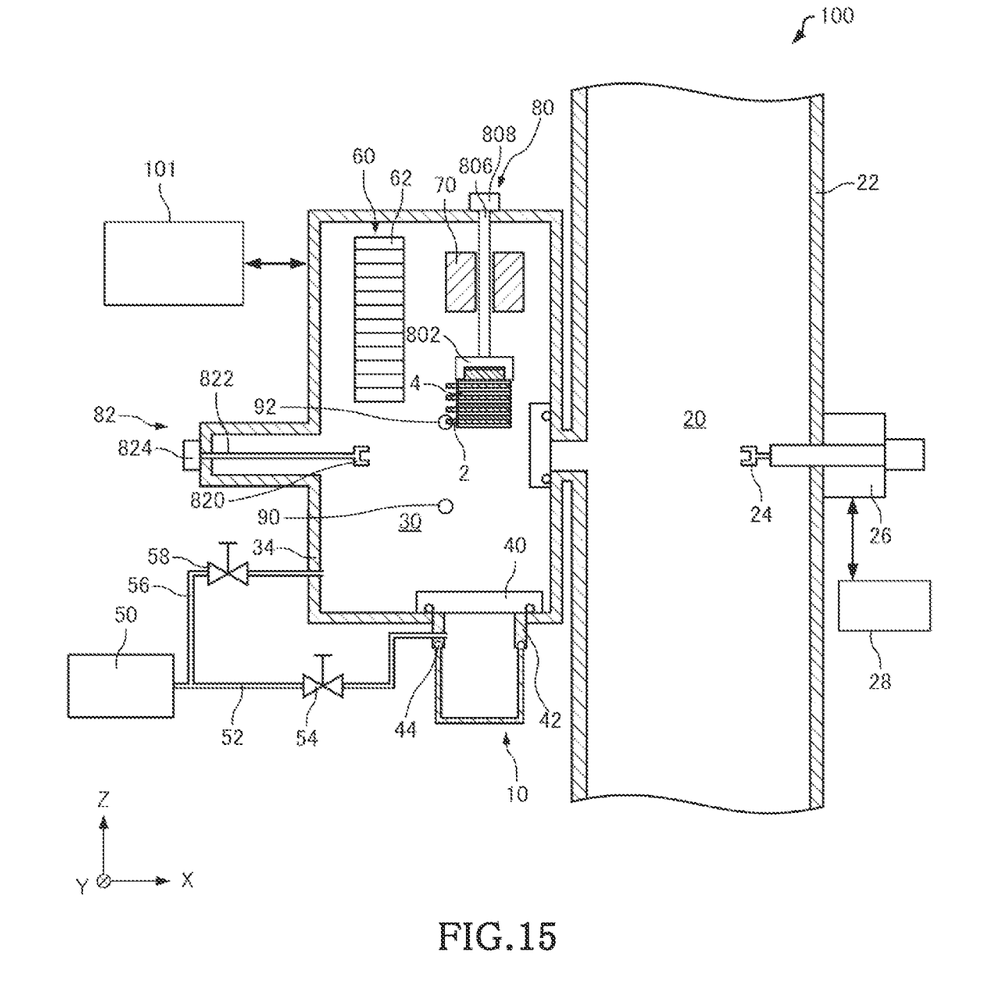

Then, the discriminator 124 detects the type of each cartridge 2 (S114). As shown in FIG. 15, the control unit 122 causes the first transport arm device 80 to move the magazine 4 such that the first stage of the magazine 4 is placed into the measurement position. The discriminator 124 determines the type of the cartridge 2 in the first stage of the magazine 4 based on the range to the cartridge 2 in the first stage measured by the laser range finder 92. Similar processing is done for the cartridges 2 in the second and following stages. For any stage for which it is determined that there is no cartridge 2, processing to identify the cartridge 2 is not performed. Because of the processing described so far, the types of all the cartridges 2 received in the magazine 4 can be identified. Information about the types of the cartridges 2 is stored in the storage section 114.

Figure 16:
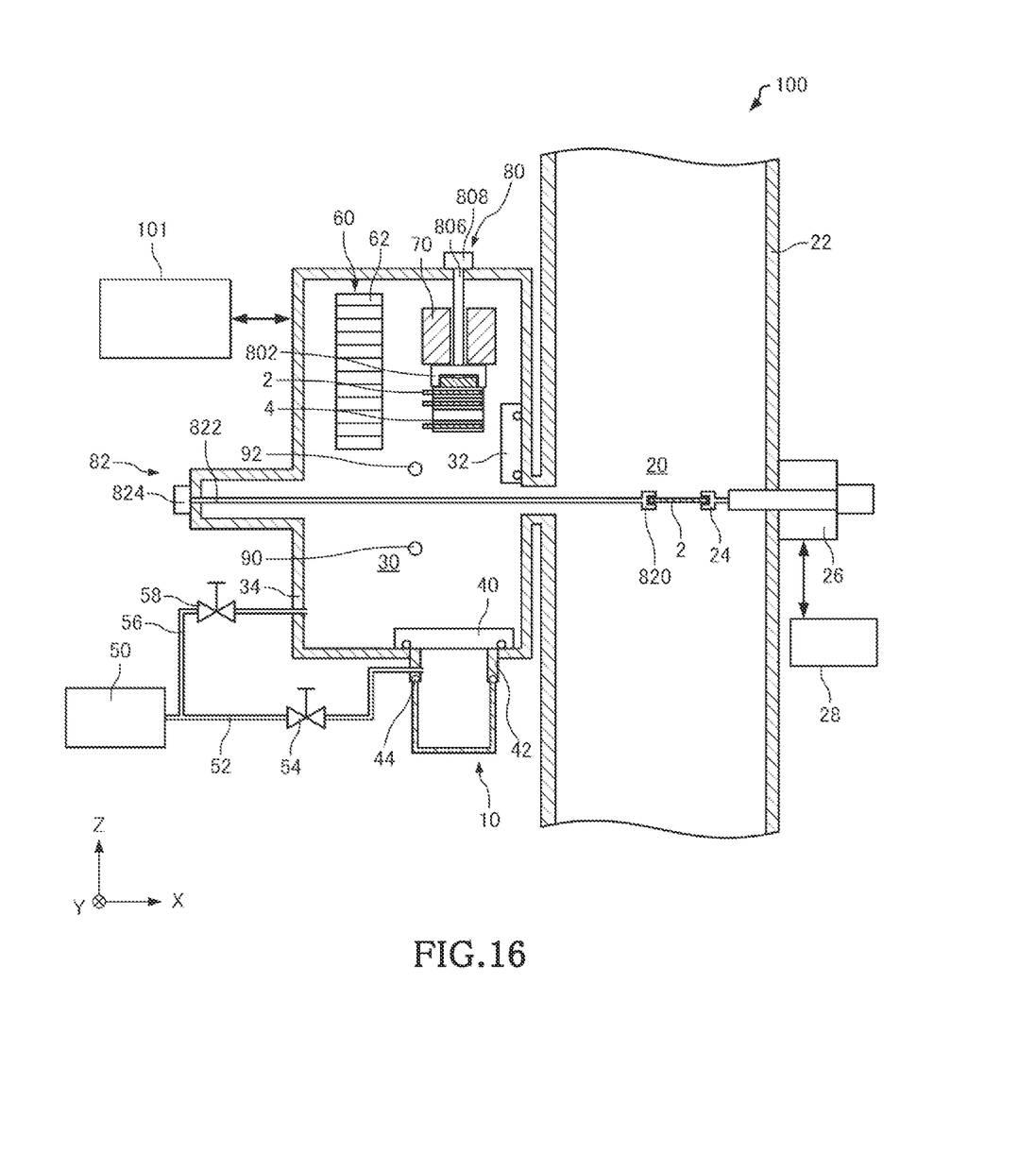

Then, as shown in FIG. 16, the control unit 122 opens the partition valve 32 (S116). The control unit 122 then causes the second transport arm device 82 to load a specified one of the cartridges 2 into the cartridge holder 24 in the sample chamber 20 (S118).

The user specifies, through the manual control section 110, the position of the cartridge 2 in the magazine 4 at which the sample to be observed is held. For example, if the second stage in the magazine 4 is specified as the position of the cartridge 2 to be detected or discerned, the control unit 122 causes the first transport arm device 80 to move the magazine 4 such that the cartridge 2 received in the second stage of the magazine 4 is placed into the delivery position. Then, the control unit 122 causes the second transport arm device 82 to grip the cartridge 2 located in the delivery position. The control unit 122 then causes the second transport arm device 82 to carry this cartridge 2 into the sample chamber 20 and to load the cartridge 2 in the cartridge holder 24. Consequently, the cartridge 2 in which the sample to be observed is held can be loaded in the cartridge holder 24.

Figure 17:
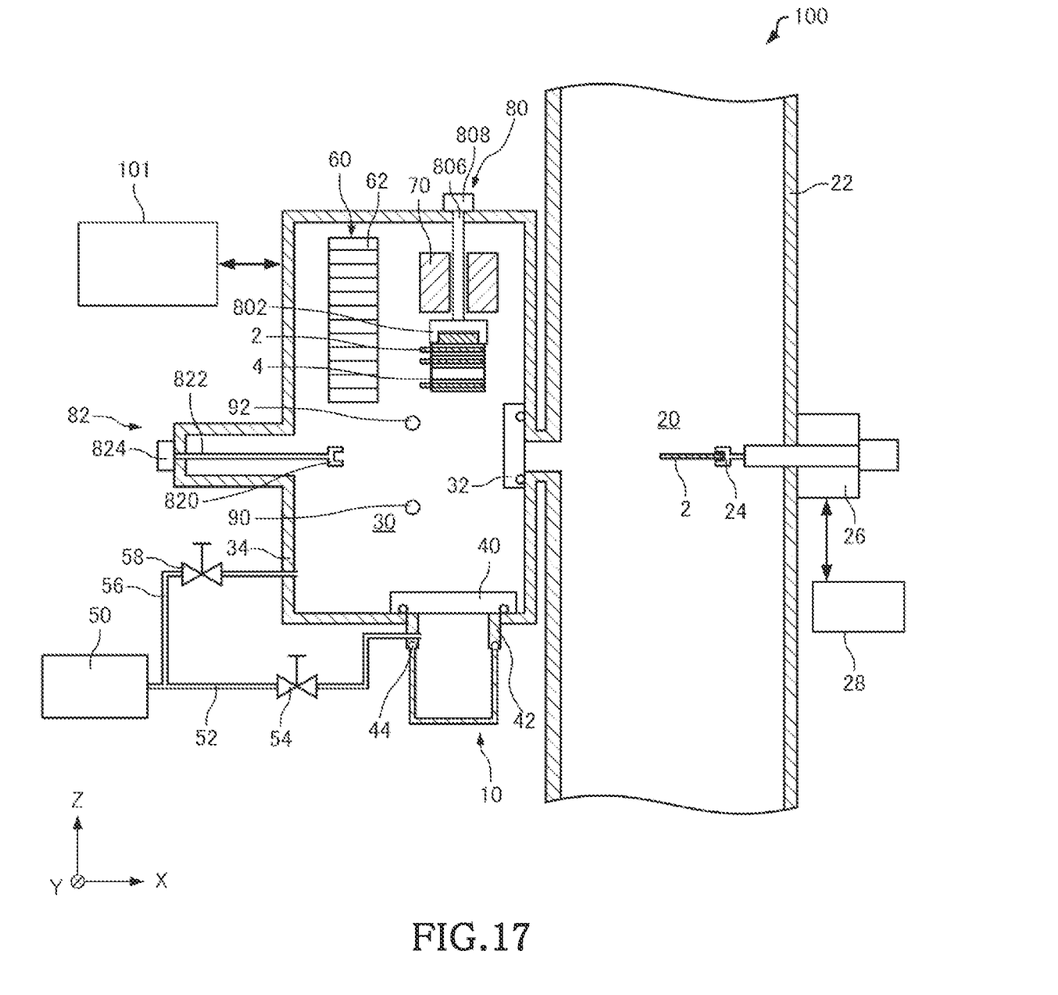

The control unit 122 moves the grip mechanism 820 into the sample exchange chamber 30 and closes the partition valve 32 as shown in FIG. 17 (S120).

The control unit 122 sends information about the type of the cartridge 2 to the stage control section 28 that controls the sample stage 26 (S122). The stage control section 28 limits the range of operation of the cartridge 2 based on the information about the type of the cartridge 2 (S124). For example, the stage control section 28 limits the angular range through which the cartridge 2 can be tilted based on the information about the type of the cartridge 2. Because of the processing described so far, the cartridge 2 is introduced into the sample chamber 20.

In the foregoing description, after the types of the cartridges 2 are detected, i.e., after the processing step S114, the cartridges 2 received in the magazine 4 are introduced into the sample chamber 20. Alternatively, the cartridges 2 received in the magazine 4 may be stored in the storage cabinet 60 after the types of the cartridges 2 are detected.

3. OPERATION AND EFFECTS

In the electron microscope 100, the first cartridge 2a out of the plural cartridges 2 has the first measurement surface 208 that is at the first distance from the laser range finder 92 when placed in the measurement position. The second cartridge 2b out of the plural cartridges 2 has the second measurement surface 218 that is at the second distance from the laser range finder 92 when placed in the measurement position. The discriminator 124 determines the type of each cartridge 2 based on its range measured by the laser range finder 92. Therefore, in the electron microscope 100, the type of the cartridge 2 can be determined precisely.

Where the type of a cartridge is identified by reading, with the sensor, either an identifier engraved in a side surface of the cartridge or the color of a small part buried in the side surface, for example, frost forming on the cartridge may hinder the reading of the identifier or color, and the type of the cartridge may be misdetected.

On the other hand, in the electron microscope 100, the type of each cartridge 2 is identified based on the range measured by the laser range finder 92 and so the identification is not affected by frost forming on the cartridge 2. Consequently, the type of the cartridge 2 can be determined precisely.

In the electron microscope 100, the first recess 206 is formed in the side surface 204 of the first cartridge 2a, and the first measurement surface 208 defines the surface of the first cartridge 2a provided with the first recess 206. The second recess 216 is formed in the side surface 214 of the second cartridge 2b, and the second measurement surface 218 is the surface of the second cartridge 2b that defines the second recess 216. The depth D1 of the first recess 206 is greater than the depth D2 of the second recess 216. Therefore, in the electron microscope 100, it is possible to discriminate between the first cartridge 2a and the second cartridge 2b based on their ranges measured by the laser range finder 92.

The electron microscope 100 includes: the second transport arm device 82 for conveying a selected one of the cartridges 2 between the sample exchange chamber 30 and the sample chamber 20; and the control unit 122 for controlling the second transport arm device 82. The control unit 122 makes the cartridges 2 received in the magazine 4 align in orientation via the second transport arm device 82. Therefore, in the electron microscope 100, the ranges to the cartridges 2 can be precisely measured by the laser range finder 92. Consequently, the electron microscope 100 can precisely determine the type of each cartridge 2.

In the electron microscope 100, the first transport arm device 80 has the grip mechanism 802 for gripping the magazine 4, the resilient member 804 coupled to the grip mechanism 802, the rod 806 receiving the resilient member 804, and the drive mechanism 808 for moving the grip mechanism 802. In this way, in the first transport arm device 80, the grip mechanism 802 is coupled to the resilient member 804 and, therefore, when the grip mechanism 802 strikes on the magazine 4, the resultant shock can be absorbed.

The electron microscope 100 includes the cooling block 70 which collides on the grip mechanism 802 when it is placed in the standby position. Therefore, the resilient member 804 can be elongated by causing the grip mechanism 802 to collide on the cooling block 70. Consequently, positional deviation of the magazine 4 can be prevented.

4. MODIFIED EMBODIMENTS

It is to be understood that the present invention is not restricted to the foregoing embodiments but rather can be practiced in variously modified forms without departing from the gist of the present invention. For example, in the above-described embodiments, there are two types of cartridges 2, i.e., first cartridge 2a and second cartridge 2b. No restrictions are imposed on the number of types of the cartridges 2 as long as the number is two or more. For example, the cartridges 2 of two or more types can be distinguished from each other by making different the depths of the recesses respectively formed in the side surfaces of the cartridges 2.

Figure 18:
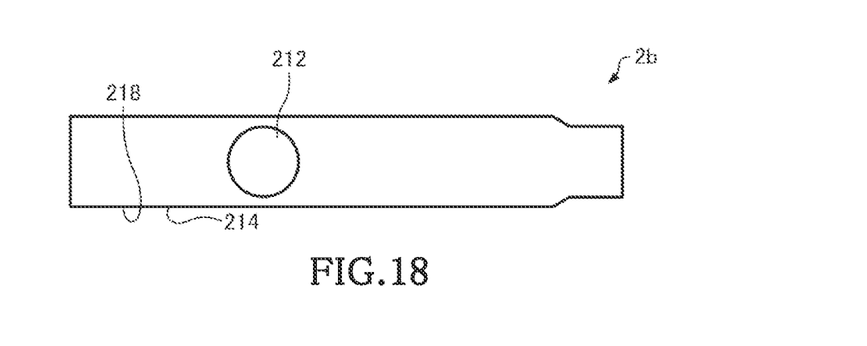
FIG. 18 is a schematic representation of another example of the second cartridge.

FIG. 18 shows another example of the second cartridge 2b. As shown in FIG. 18, this cartridge 2b has a flat side surface 214 provided with no recess. The second measurement surface 218 may be the side surface 214 of the second cartridge 2b. Even in this case, the first cartridge 2a and the second cartridge 2b can be discriminated from each other based on the result of the measurement made by the laser range finder 92.

Furthermore, in the foregoing description of the above embodiments, the charged particle beam system associated with the present invention is a transmission electron microscope. No restriction is placed on the charged particle beam system associated with the present invention as long as the system uses a charged particle beam such as a beam of electrons or ions. The charged particle beam system associated with the present invention may be an electron microscope (such as a scanning transmission electron microscope (STEM) or a scanning electron microscope (SEM)), an electron probe microanalyzer (EPMA), a focused ion beam (FIB) system, an electron beam exposure system, or the like It is to be understood that the present invention is not restricted to the foregoing embodiments but rather can be implemented in various modified forms. For example, the present invention embraces configurations (e.g., configurations identical in function, method, and results or identical in purpose and advantageous effects) which are substantially identical to the configurations described in the above embodiments. Furthermore, the invention embraces configurations which are similar to the configurations described in the above embodiments except that their nonessential portions have been replaced. Additionally, the invention embraces configurations which are identical in advantageous effects to, or which can achieve the same object as, the configurations described in the above embodiments. Further, the invention embraces configurations which are similar to the configurations described in the above embodiments except that a well-known technique is added.

What is claimed is:

1. A charged particle beam system comprising:
   a plurality of cartridges comprising a first cartridge of a first type and a second cartridge of a second type different from the first type;
   a cartridge magazine configured to accommodate the cartridges;
   a sample chamber that is vacuum pumped;
   a sample exchange chamber in communication with the sample chamber via a partition valve;
   a first transport arm device for conveying the magazine in the sample exchange chamber;
   a laser range finder for measuring a range to a selected one of the cartridges accommodated in the magazine, the selected cartridge being placed in a measurement position; and
   a discriminator for determining the type of the selected cartridge based on the range measured by the laser range finder;
   wherein said first cartridge has a first measurement surface that is at a first range to the laser range finder when the first cartridge is placed in the measurement position; and
   wherein said second cartridge has a second measurement surface that is at a second range, different from the first range, to the laser range finder when the second cartridge is placed in the measurement position.

2. A charged particle beam system as set forth in claim 1, wherein said first cartridge has a side surface provided with a first recess, and wherein said first measurement surface is the side surface of the first cartridge that defines the first recess.

3. A charged particle beam system as set forth in claim 2,
   wherein said second cartridge has a side surface provided with a second recess,
   wherein said second measurement surface is the side surface of the second cartridge that defines the second recess, and
   wherein said first recess is deeper than said second recess.

4. A charged particle beam system as set forth in claim 2, wherein a side surface of said second cartridge is flat, and wherein said second measurement surface is the side surface of the second cartridge.

5. A charged particle beam system as set forth in claim 1, further comprising: a second transport arm device for conveying said selected cartridge between said sample exchange chamber and said sample chamber; and a control unit for controlling the second transport arm device;
   wherein the control unit actuates the second transport arm device in such a way that the cartridges accommodated in said magazine are aligned in orientation.

6. A charged particle beam system as set forth in claim 1, wherein said first transport arm device has a grip mechanism for gripping said magazine, a resilient member coupled to the grip mechanism, a rod in which the resilient member is accommodated, and a drive mechanism for moving the grip mechanism.

7. A charged particle beam system as set forth in claim 6, further comprising a block that strikes on said grip mechanism when the grip mechanism is placed in a standby position.

* * * * *